(12) United States Patent
Lin et al.

(10) Patent No.: US 9,343,390 B2
(45) Date of Patent: May 17, 2016

(54) TSV FORMATION PROCESSES USING TSV-LAST APPROACH

(71) Applicant: Taiwan Semiconductor Manufacturing Company, Ltd., Hsin-Chu (TW)

(72) Inventors: Jing-Chen Lin, Hsin-Chu (TW); Yung-Chi Lin, Su-Lin (TW); Ku-Feng Yang, Dali (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 389 days.

(21) Appl. No.: 13/691,178

(22) Filed: Nov. 30, 2012

(65) Prior Publication Data

US 2013/0093042 A1 Apr. 18, 2013

Related U.S. Application Data

(63) Continuation of application No. 12/834,304, filed on Jul. 12, 2010, now Pat. No. 8,338,939.

(51) Int. Cl.
*H01L 23/48* (2006.01)
*H01L 21/768* (2006.01)
*H01L 29/78* (2006.01)

(52) U.S. Cl.
CPC ........ *H01L 23/481* (2013.01); *H01L 21/76898* (2013.01); *H01L 29/78* (2013.01); *H01L 2224/131* (2013.01)

(58) Field of Classification Search
CPC .......................... H01L 21/76898; H01L 23/481
USPC .......... 257/737, 784, E21.499, E23.011, 690,
257/691, 692, 693; 438/55, 106, 107, 113,
438/124, 125, 126, 127
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,716,737 B2 * | 4/2004 | Plas et al. ...................... 438/612 |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |

(Continued)

*Primary Examiner* — David Vu
(74) *Attorney, Agent, or Firm* — Slater Matsil, LLP

(57) ABSTRACT

A device includes a semiconductor substrate having a front surface and a back surface opposite the front surface. An insulation region extends from the front surface into the semiconductor substrate. An inter-layer dielectric (ILD) is over the insulation region. A landing pad extends from a top surface of the ILD into the insulation region. A through-substrate via (TSV) extends from the back surface of the semiconductor substrate to the landing pad.

17 Claims, 9 Drawing Sheets

(56) References Cited

U.S. PATENT DOCUMENTS

| | | |
|---|---|---|
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,985,620 B2 * | 7/2011 | Kaskoun et al. ............... 438/107 |
| 2010/0032764 A1 * | 2/2010 | Andry et al. ................. 257/369 |
| 2012/0007154 A1 | 1/2012 | Lin et al. |

* cited by examiner

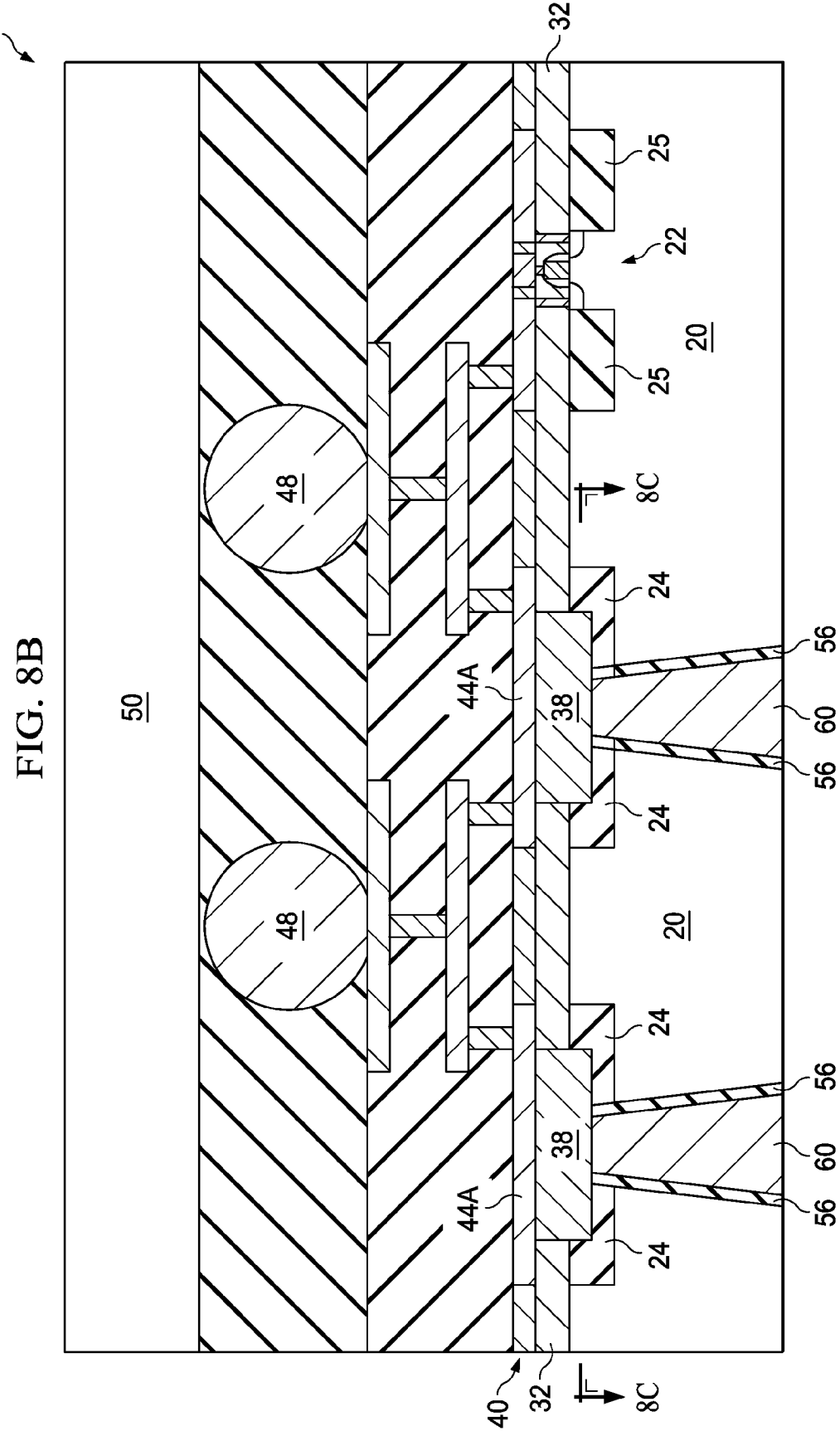

TSV FORMATION PROCESSES USING TSV-LAST APPROACH

This application is a continuation of and claims benefit of U.S. patent application Ser. No. 12/834,304, filed Jul. 12, 2010, entitled "TSV Formation Processes Using TSV-Last Approach," which application is hereby incorporated herein by reference.

TECHNICAL FIELD

This disclosure relates generally to interconnection structures, and more particularly to structures and manufacturing methods of TSVs.

BACKGROUND

Among the efforts to increase device density in integrated circuits, three-dimensional integrated circuits (3DICs) are commonly used. Through-substrate vias (TSV) are often used in 3DIC for connecting multiple dies to package substrates. There are several commonly used approaches for forming TSVs. For example, TSVs may be formed before inter-layer dielectric (ILD) is formed (which approach is referred to as a via-first approach), or formed after the formation of ILD and before the formation of the bottom metal layer (M1, which approach is referred to as a via-middle approach). TSVs may also be formed after all metal layers and passivation layers are formed, and may be formed from the front side or the back side of the respective wafers/chips, which approaches are referred to as via-last approaches.

In the manufacturing of TSVs using the via-last approach, wherein the TSVs are formed from the backside of a wafer, an etch needs to be performed to etch through a semiconductor substrate, shallow-trench isolation (STI) pads, and an inter-layer dielectric over the STI pads, so that the metal pads in a bottom metal layer are exposed through the respective TSV openings. However, serious lateral etching may occur in the ILD, causing the portions of the TSV openings in the ILD to be wider than the portions of the TSV openings in the semi-conductor substrate. This results in difficulty in the formation of isolation layers, which are formed on the sidewall of the TSV openings. Further, during the formation of the TSV openings, the metal pads in the bottom metal layer may be undesirably etched. Since the metal pads are very thin, they may also be etched through.

SUMMARY

In accordance with one aspect, a device includes a semiconductor substrate having a front surface and a back surface opposite the front surface. An insulation region extends from the front surface into the semiconductor substrate. An inter-layer dielectric (ILD) is over the insulation region. A landing pad extends from a top surface of the ILD into the insulation region. A through-substrate via (TSV) extends from the back surface of the semiconductor substrate to the M0 metal pad.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel through-substrate via (TSV) and the methods of forming the same are provided. The intermediate stages of manufacturing an embodiment are illustrated. The variations of the embodiment are discussed. Throughout the various views and illustrative embodiments, like reference numbers are used to designate like elements.

Figure 1:
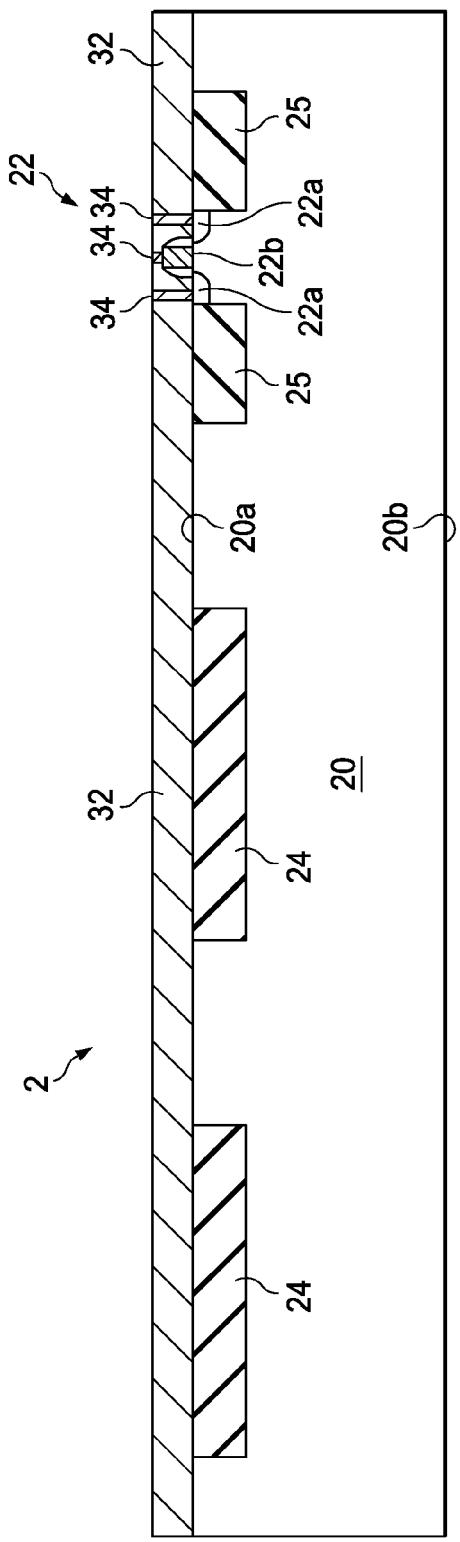
FIGS. 1 through 8B are cross-sectional views of intermediate stages in the manufacturing of a TSV in accordance with an embodiment.

Referring to FIG. 1, wafer 2, which comprises substrate 20, is provided. Substrate 20 may be a silicon substrate, or may be formed of other commonly used semiconductor materials. In addition, substrate 20 may be in the form of a bulk semiconductor. Integrated circuits 22, which are symbolized using a transistor, may be formed at the surface of substrate 20. Substrate 20 includes front surface 20a and back surface 20b.

Shallow trench isolation (STI) regions 24 and 25 are formed in substrate 20, for example, by forming shallow trenches in substrate 20, and then filling the trenches with a dielectric material. STI regions 24 may also be referred to as STI pads 24. An exemplary dielectric material includes high-density plasma (HDP) silicon oxide. In an embodiment, STI pads 24 are formed simultaneously with the formation of STI regions 25, which are used for isolating active devices such as transistors. Alternatively, STI pads 24 and STI regions 25 are separately formed so that STI regions 24 may have an optimized thickness different from the thickness of STI regions 25.

Referring again to FIG. 1, an etch stop layer (ESL, not shown) may be blanket formed over integrated circuits 22, substrate 20, and STI regions 24 and 25. Inter-layer dielectric (ILD) 32 is then formed over the ESL. ILD 32 may be formed of phospho-silicate glass (PSG), boron-phospho-silicate glass (BPSG), or the like. Gate contact plugs and source/drain contact plugs 34, which may be formed of tungsten, may then be formed in ILD 32 and electrically coupled to integrated circuits 22. As shown in FIG. 1, contact plugs 34 (including gate contact plugs and source/drain contact plugs) are coupled to source and drain regions 22A, and gate electrode 22B of a transistor.

Figure 2A:
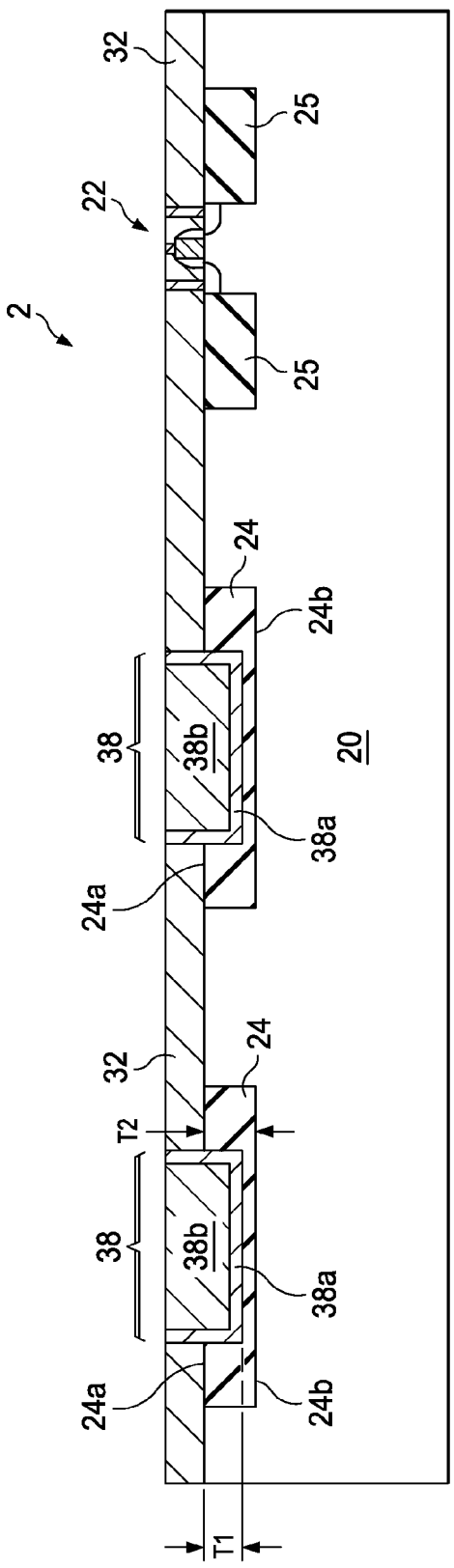
Figure 2B:
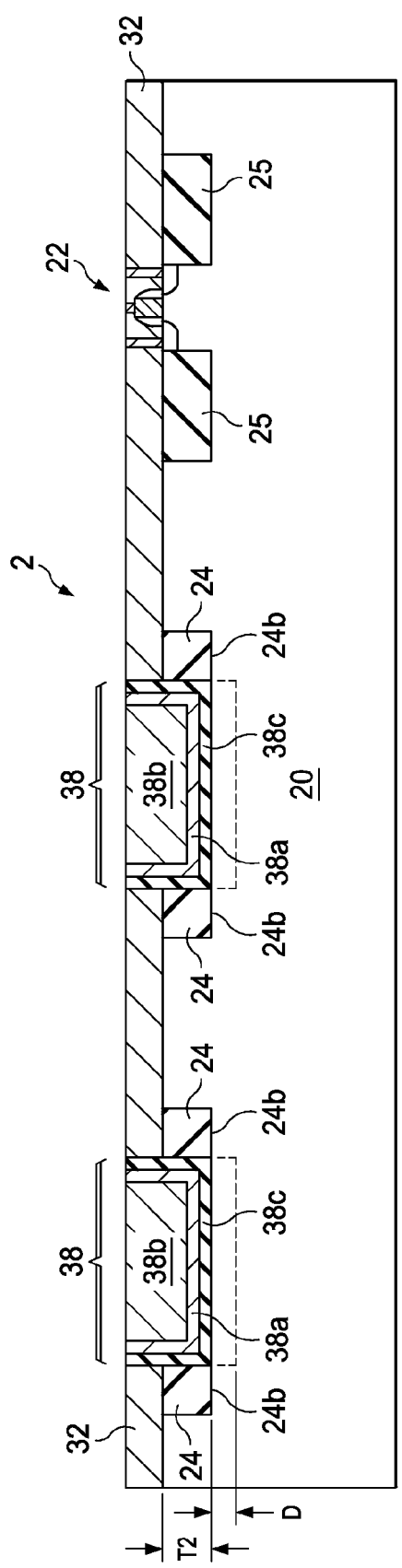

Referring to FIGS. 2A and 2B, TSV landing pads 38 (referred to as M0 metal pads 38 hereinafter) are formed. M0 metal pads 38 are such named since they are under the subsequently formed bottom metal layer that is commonly known as M1, as illustrated as 40 in FIG. 3. M0 metal pads 38 are formed by etching ILD 32 and STI pads 24 to form openings, and filling metallic materials into the openings. In an embodiment as shown in FIG. 2A, STI regions 24 are not etched through, and the etching is stopped at an intermediate level between top surfaces 24a and bottom surfaces 24b of STI regions 24. Accordingly, the bottom surfaces of M0 metal pads 38 are between surfaces 24a and 24b of STI pads 24. Each of M0 metal pads 38 may include conductive barrier layer 38A and inner region 38B. Barrier layer 38A may be formed of titanium, titanium nitride, tantalum, tantalum nitride, or the like, while inner region 38B may be formed of copper or copper alloys. In an exemplary embodiment, the portions of M0 metal pads 38 inside STI pads 24 have thickness T1, which may be greater than about 10 percent, or even greater than about 30 percent, thickness T2 of STI pads 24. The sidewalls of M0 metal pads 38 may be substantially straight.

In alternative embodiments as shown in FIG. 2B, the openings for M0 metal pads 38 extend to level with, or lower than (as shown with dotted lines), bottom surfaces 24b of STI pads 24. Accordingly, dielectric liners 38C are formed, wherein barrier layer 38A may be formed on dielectric liners 38C, followed by the formation of inner region 38B. In an exemplary embodiment, M0 metal pads 38 may extend below bottom surfaces 24b of STI pads 24 by distance D greater than about 5 percent, or even greater than about 10 percent, thickness T2 of STI pads 24.

Figure 3:
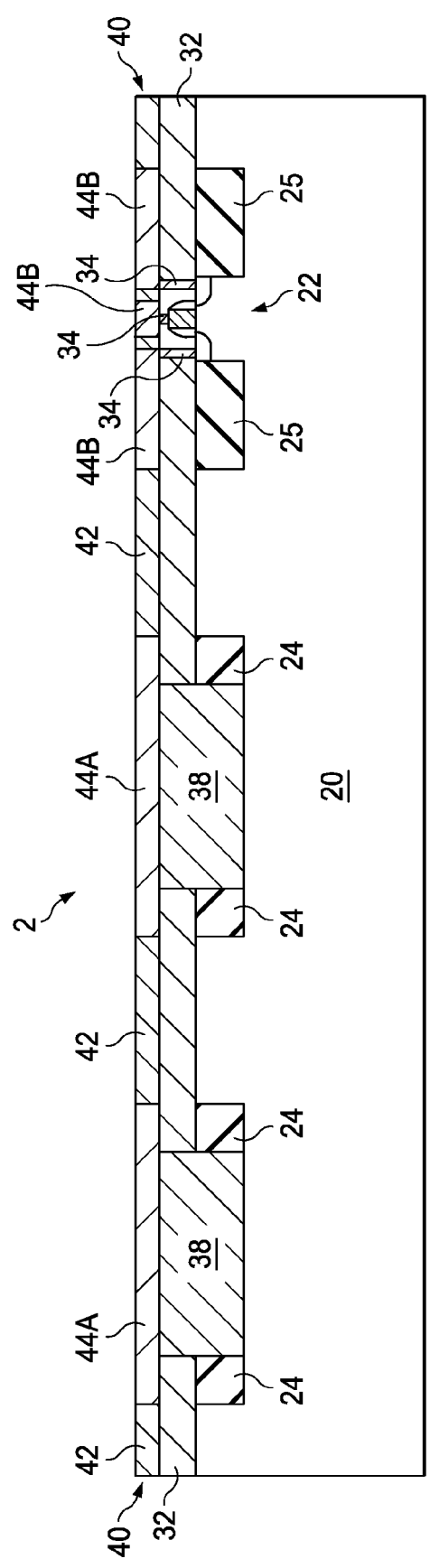

Next, as shown in FIG. 3, bottom metal layer 40 is formed, and includes dielectric layer 42 (commonly known as an inter-metal dielectric (IMD)), and metal pads 44A and metal lines 44B in dielectric layer 42. IMD 42 and overlying IMDs that are formed in subsequent process steps may be formed of low-k dielectric materials. M1 pads 44A contact M0 metal pads 38, and may have a top view shape the same as the top view shape of the respective underlying M0 metal pads 38. Further, metal lines 44B are connected to contact plugs 34.

Figure 4:
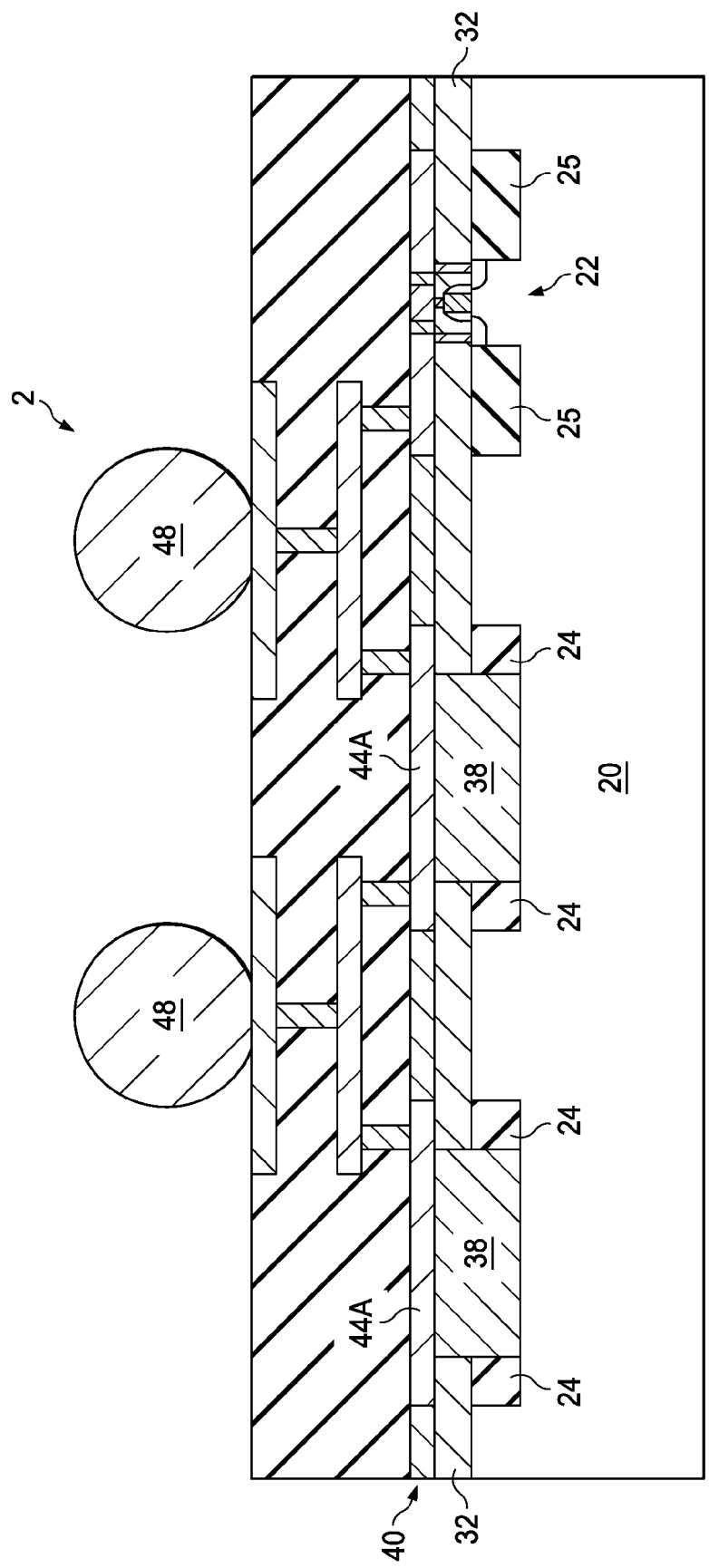

In subsequent steps, as shown in FIG. 4, additional metal layers (not marked) are formed, followed by the formation of passivation layers (not marked) and metal bumps 48. The formation of the front-side structures of the respective wafer 2 is thus finished. The details of formation processes are known in the art, and thus are not discussed herein.

Figure 5:
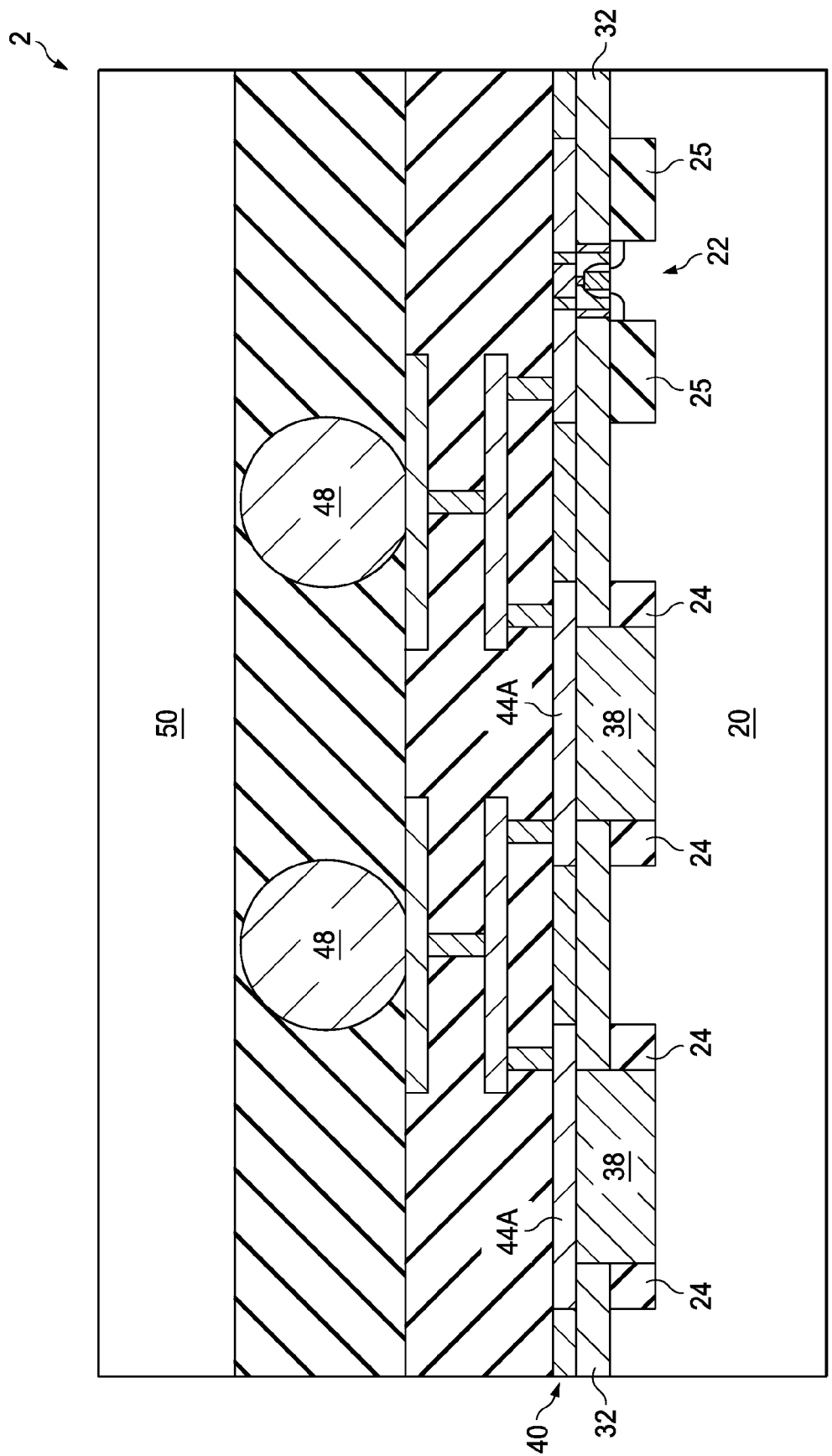
Figure 6:
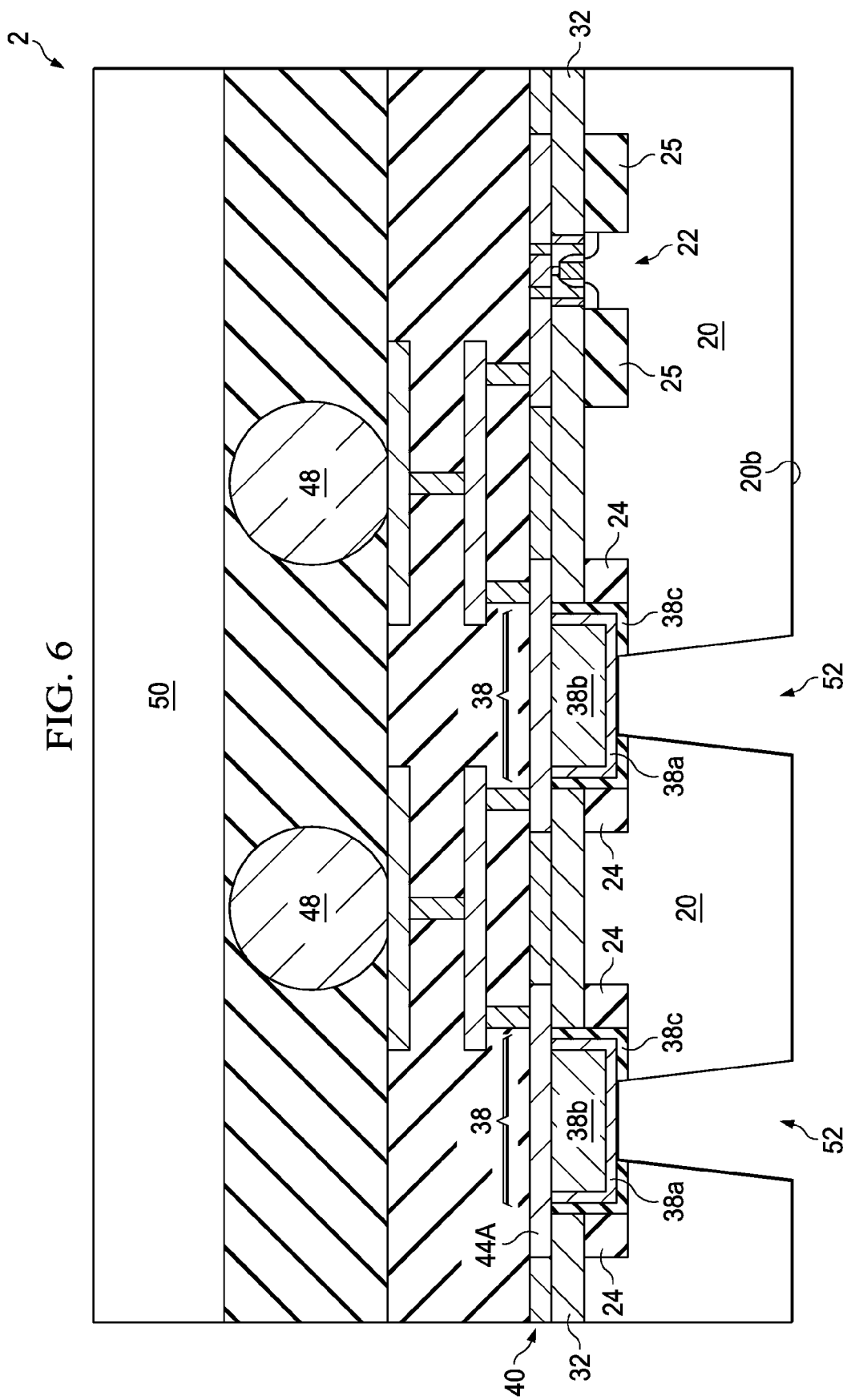

Referring to FIG. 5, carrier 50 is bonded to the front side of wafer 2. The backside of substrate 20 is grinded, until the thickness of substrate 20 is reduced to a level suitable for forming TSVs. Next, as shown in FIG. 6, TSV openings 52 are formed by etching substrate 20 from back surface 20b. In the embodiments wherein M0 metal pads 38 have the structure as shown in FIG. 2A, an additional etching step is performed to etch the portions of STI pads 24 that are directly underlying M0 metal pads 38 (please refer to FIG. 8B, wherein the TSV openings are filled with TSVs 60 and isolation layers 56). M0 metal pads 38 are thus exposed through TSV opening 52. In the embodiments wherein M0 metal pads 38 have the structure as shown in FIG. 2B, dielectric liner 38C is also etched, as shown in FIG. 6. Further, openings 52 may penetrate through barrier layer 38A and stop on inner region 38B, or stop on barrier layer 38A.

Figure 7:
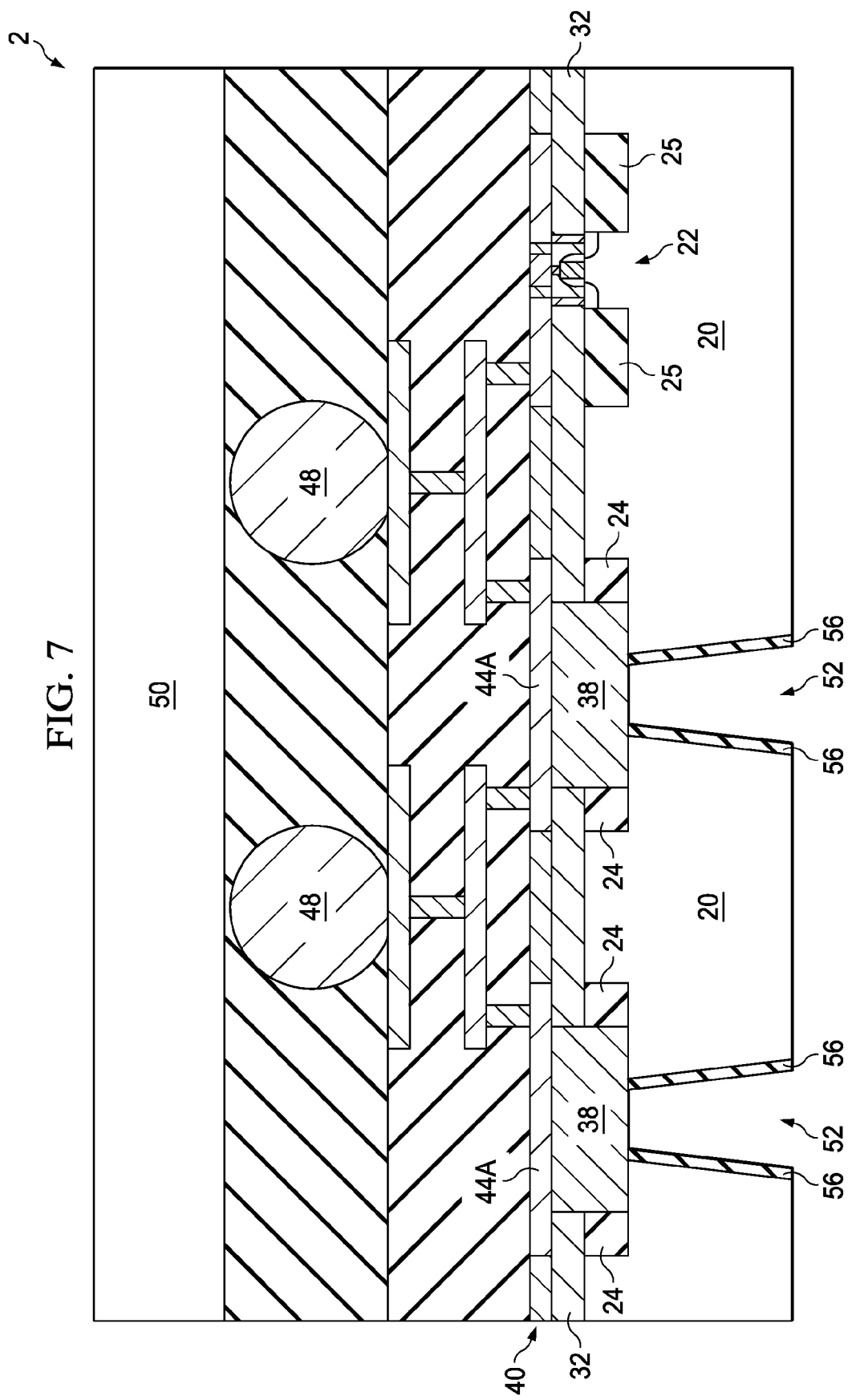

Referring to FIG. 7, isolation layer 56 is formed in TSV openings 52 and on sidewalls of substrate 20, which sidewalls are exposed to TSV openings 52. Isolation layer 56 may be formed of silicon nitride, silicon oxide, or the like, although other commonly used dielectric materials may be used. Next, the bottom portions of isolation layer 56 are removed, for example, using a dry etch. M0 metal pads 38 are thus exposed again.

Figure 8A:
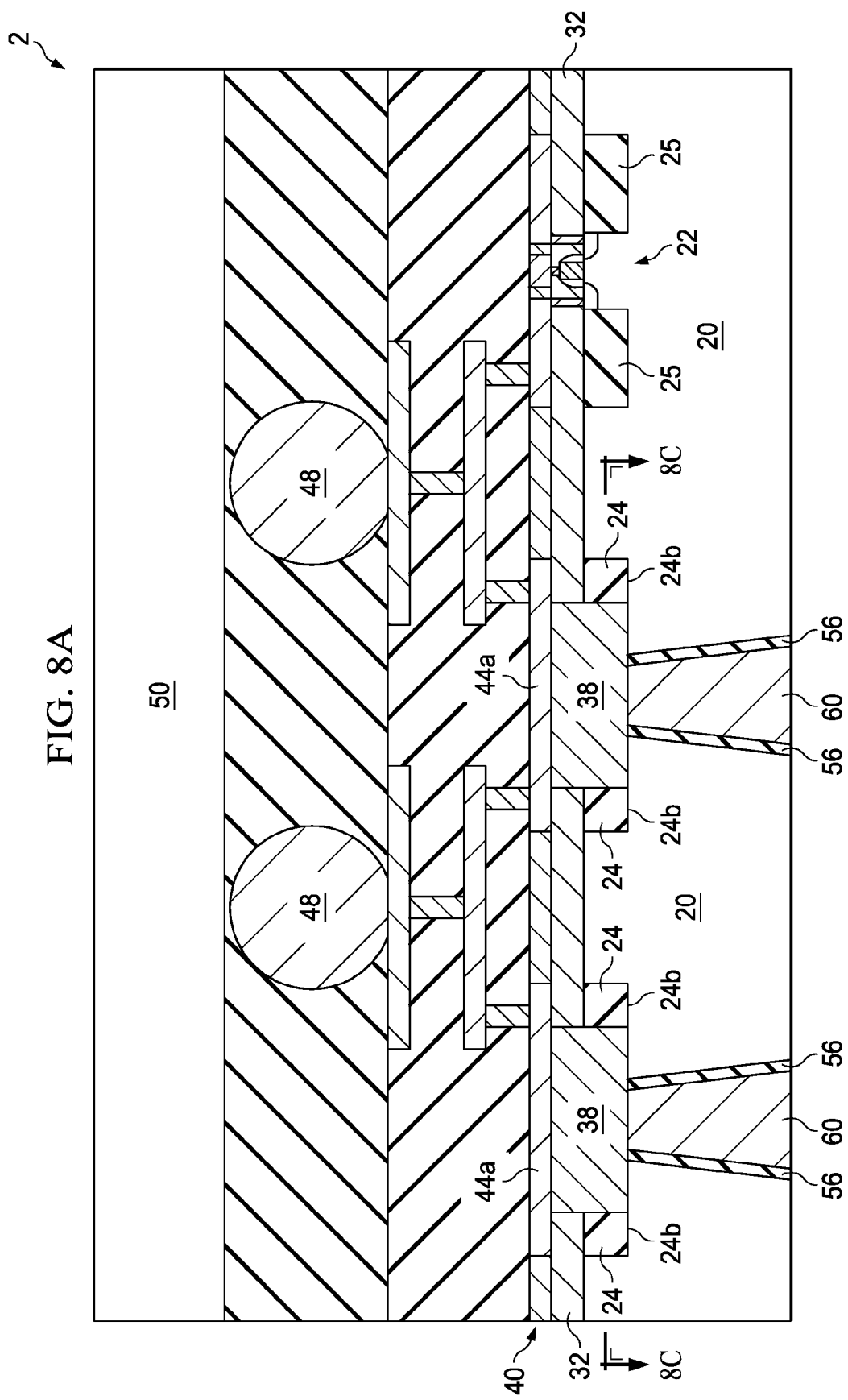
FIG. 8C illustrates a top view of the embodiments shown in FIGS. 8A and 8B.

In FIG. 8A, TSVs 60 are formed. An exemplary formation process of TSVs 60 includes forming a barrier layer (not shown), a seed layer (not shown) on the barrier layer, and then performing an electro-chemical plating (ECP) to fill the remaining portions of TSV openings 52 with a metallic material such as copper. The barrier layer may be formed of titanium, titanium nitride, tantalum, tantalum nitride, or the like. The seed layer may be formed copper. A planarization step may be performed to remove excess portions of the barrier layer, the seed layer, and the filling material outside TSV openings 52. The remaining portions are TSVs 60. In a subsequent step, carrier 50 is de-bonded from wafer 2.

FIG. 8B illustrates the structure formed from the structure shown in FIG. 2A. In this embodiment, it is observed that TSVs 60 extend over bottom surfaces 24b of STI pads 24, and extend into lower portions of the respective STI pads 24. Depending on where TSV openings 52 stop, TSVs 60 may contact a bottom surface of barrier layer 38A (please refer to FIG. 6), or penetrate through barrier layer 38A to contact inner region 38B.

Figure 8C:
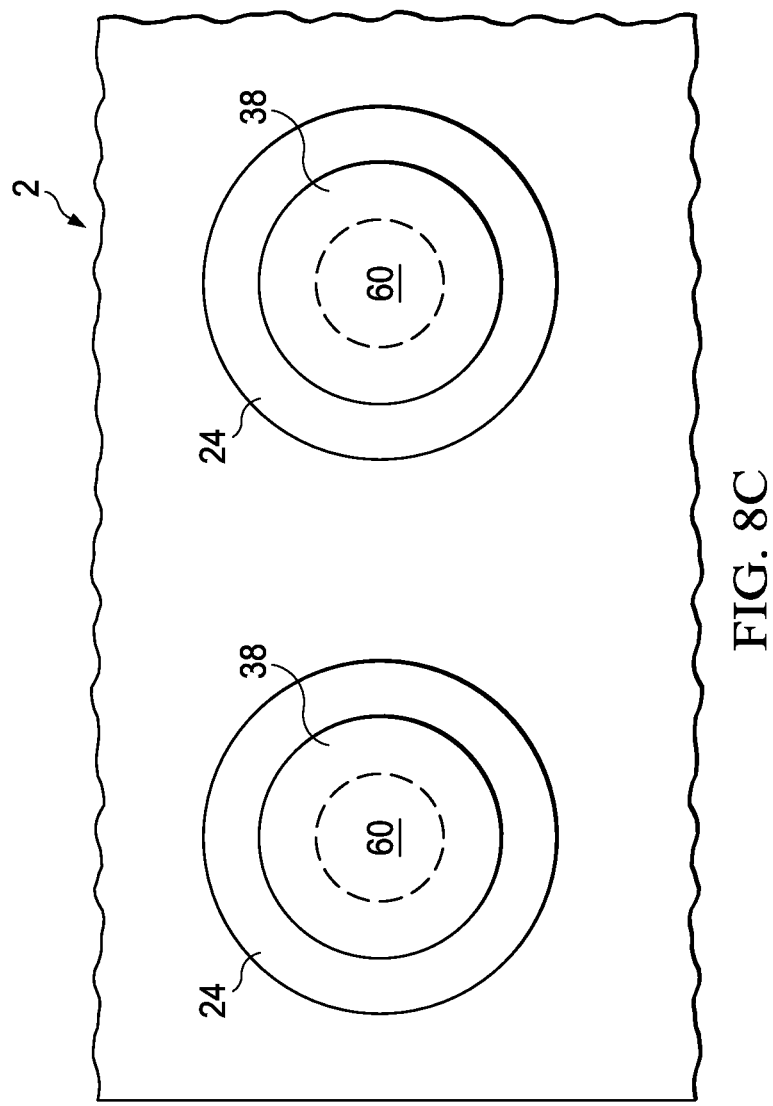

FIG. 8C illustrates a top view of the structure as shown in FIGS. 8A and 11B, wherein the top view is obtained from planes crossing lines 11C-11C in FIGS. 8A and 11B. In the top view, STI pads 24 may have a round shape, a rectangular shape, or any other polygon shape such as a hexagon shape or an octagon shape. TSVs 60 and M0 metal pad 38 may also have shapes similar to each other. Further, TSVs 60 contact center regions of the respective M0 metal pads 38.

With the formation of M0 metal pads 38, and TSVs 60 that land on M0 metal pads 38, the process window is significantly increased. Due to the great thickness of M0 metal pads 38, there will be no damage to M1 metal pads 44A during the formation of TSVs 60. Accordingly, TSVs 60 may be reliably coupled to M1 pads 44A.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit structure comprising:
    a semiconductor substrate;
    a shallow trench isolation (STI) region extending from a top surface of the semiconductor substrate into the semiconductor substrate;
    a metal pad extending from a top surface of the STI region into the STI region, wherein the metal pad is encircled by the STI region, with an edge of the metal pad being in contact with an inner edge of the STI region to form an interface; and
    a through-substrate via (TSV) extending from a back surface of the semiconductor substrate to contact a first portion of a bottom surface of the metal pad, with a second portion of the bottom surface of the metal pad extending beyond edges of the TSV.

2. The circuit structure of claim 1 further comprising:
    an inter-layer dielectric (ILD) over the STI region, wherein the metal pad further extends into the ILD.

3. The circuit structure of claim 1, wherein the interface is lower than the top surface of the semiconductor substrate.

4. The circuit structure of claim 1, wherein a bottom surface of the metal pad is between the top surface and a bottom surface of the STI region, and wherein the TSV penetrates through a lower portion of the STI region to contact the metal pad.

5. The circuit structure of claim 1, wherein a top surface of the STI region is lower than a top surface of the metal pad.

6. The circuit structure of claim 1, wherein the interface extends from the top surface of the semiconductor substrate into the semiconductor substrate.

7. The circuit structure of claim 1, wherein the bottom surface of the STI region is at an intermediate level between the top surface and the back surface of the semiconductor substrate.

8. The circuit structure of claim 1, wherein the STI region has substantially vertical sidewalls extending to an intermediate level between the top surface and the back surface of the semiconductor substrate.

9. The circuit structure of claim 8, wherein the STI region extends beyond a sidewall of the metal pad outwardly for a first thickness, and the STI region extends deeper than the metal pad by a second thickness, and the first thickness is greater than the second thickness.

10. A circuit structure comprising:
a semiconductor substrate;
a shallow trench isolation (STI) region extending from a top surface of the semiconductor substrate into the semiconductor substrate;
a metal pad extending from a level higher than a top surface of the STI region into a center portion the STI region, with an outer portion of the STI region forming a ring encircling the metal pad, wherein the outer portion comprises an inner edge in physical contact an edge of the metal pad to form an interface, and the interface forms a full ring; and
a through-substrate via (TSV) extending from a back surface of the semiconductor substrate to contact a bottom surface of the metal pad.

11. The circuit structure of claim 10 further comprising:
an inter-layer dielectric (ILD) over the STI region, wherein the metal pad further extends into the ILD, and wherein edges of a portion of the metal pad in the ILD are substantially aligned to respective edges of a portion of the metal pad in the STI region.

12. The circuit structure of claim 11, wherein the interface extends from the top surface of the semiconductor substrate into the semiconductor substrate.

13. The circuit structure of claim 10, wherein the STI region and the metal pad have circular-shaped edges.

14. The circuit structure of claim 10 further comprising:
an additional STI region, wherein both the STI region and the additional STI region extend from the top surface of the semiconductor substrate to stop at a same intermediate level between the top surface and the back surface of the semiconductor substrate; and
a transistor comprising a source/drain region having a sidewall contacting a sidewall of the additional STI region.

15. A circuit structure comprising:
a semiconductor substrate;
a first shallow trench isolation (STI) region and a second STI region extending from a top surface of the semiconductor substrate into the semiconductor substrate, with bottom surfaces of both the first STI region and the second STI region at a same intermediate level between a top surface and a bottom surface of the semiconductor substrate;
a transistor comprising a source/drain region having a sidewall contacting a sidewall of the second STI region;
a metal pad extending from a level higher than a top surface of the first STI region into a center portion the first STI region, with an outer portion of the first STI region forming a ring encircling the metal pad; and
a through-substrate via (TSV) extending from a back surface of the semiconductor substrate to contact a bottom surface of the metal pad.

16. The circuit structure of claim 15, wherein the outer portion comprises an inner edge in physical contact an edge of the metal pad to form an interface, and the interface forms a full ring.

17. The circuit structure of claim 15, wherein the first STI region and the second STI region are formed of a same dielectric material.

* * * * *